United States Patent
Narigapalli et al.

(10) Patent No.: US 11,644,876 B2
(45) Date of Patent: May 9, 2023

(54) DATA ANALYTICS FOR MITIGATION OF DATA CENTER THERMAL ISSUES

(71) Applicant: KYNDRYL, INC., New York, NY (US)

(72) Inventors: Anil Kumar Narigapalli, Hyderabad (IN); Laxmikantha Sai Nanduru, R K Puram Post (IN); Venkateswarlu Basyam, Hyderabad (IN); Srilakshmi Surapaneni, Hyderabad (IN)

(73) Assignee: Kyndryl, Inc., New York, NY (US)

( * ) Notice: Subject to any disclaimer, the term of this patent is extended or adjusted under 35 U.S.C. 154(b) by 197 days.

(21) Appl. No.: 17/301,378

(22) Filed: Mar. 31, 2021

(65) Prior Publication Data

US 2022/0317744 A1 Oct. 6, 2022

(51) Int. Cl.
*G06F 1/20* (2006.01)
*H05K 7/20* (2006.01)

(52) U.S. Cl.
CPC ......... *G06F 1/206* (2013.01); *H05K 7/20709* (2013.01)

(58) Field of Classification Search
CPC . G06F 1/206; H05K 7/20709; H05K 7/20836
See application file for complete search history.

(56) References Cited

U.S. PATENT DOCUMENTS

| | | | |
|---|---|---|---|
| 6,574,104 B2 | 6/2003 | Patel | |
| 8,463,900 B2 | 6/2013 | Dasgupta | |
| 8,621,248 B1 | 12/2013 | Weber | |
| 8,671,294 B2 | 3/2014 | Malik | |
| 8,688,620 B2 | 4/2014 | Viswanathan | |
| 8,849,469 B2 | 9/2014 | Belady | |
| 9,405,348 B2 | 8/2016 | Jackson | |
| 9,448,544 B2 | 9/2016 | Slessman | |
| 9,557,792 B1 | 1/2017 | Potlapally | |
| 9,709,965 B2 | 7/2017 | Slessman et al. | |

(Continued)

OTHER PUBLICATIONS

Aghdai, et al., "Intelligent Anomaly Detection and Mitigation in Data Centers", arXiv:1906.06388v1, Jun. 14, 2019, 7 pages, <https://deepai.org/publication/intelligent-anomaly-detection-and-mitigation-in-data-centers>.

(Continued)

*Primary Examiner* — Mischita L Henson

(57) ABSTRACT

Mitigating the impact of data center thermal environmental issues on production applications includes retrieving, by a computer, from a centralized repository first data corresponding to I/O and processing activities of an infrastructure component executing one or more applications, second data corresponding to an application-to-infrastructure map, and third data corresponding to a business priority of the one or more applications. Based on the first data and the second data, the one or more applications are mapped to heat generation values of the infrastructure component, and based on the mapping a thermal load of the one or more applications on the infrastructure component is determined using data analytics. Using the third data, the computer identifies an execution priority for the one or more applications, generates a correlative mapping between the execution priority and the thermal load of the one or more applications, and generates a resolution plan based on the correlative mapping.

15 Claims, 8 Drawing Sheets

(56) References Cited

U.S. PATENT DOCUMENTS

| | | |
|---|---|---|
| 9,791,837 B2 | 10/2017 | Slessman |
| 2012/0232877 A1 | 9/2012 | Bhagwat |
| 2012/0284216 A1 | 11/2012 | Hamann |
| 2013/0166241 A1 | 6/2013 | Hamann |
| 2014/0039683 A1* | 2/2014 | Zimmermann ....... G06F 1/3206 700/275 |
| 2014/0183957 A1* | 7/2014 | Duchesneau ......... F01K 13/006 307/64 |
| 2018/0088639 A1 | 3/2018 | Remis |
| 2019/0163540 A1 | 5/2019 | Lee |

OTHER PUBLICATIONS

Lynch, Ken, "Data Center Risk Management: How to Have an Effective Plan", Colocation America, Feb. 27, 2019, 6 pages, <https://www.colocationamerica.com/blog/data-center-risk-management>.

Mell, et al., "The NIST Definition of Cloud Computing", National Institute of Standards and Technology, Special Publication 800-145, Sep. 2011, 7 pages.

Mulligan, et al., "Predictive Analytics are Key to a Smart, Proactive Business Approach", Data Center Frontier, Jun. 8, 2020, 5 pages, <https://datacenterfrontier.com/predictive-analytics-key-to-proactive-business-approach/>.

Simon, Gerd, "Understanding and Mitigating Risks to Data Center Operation", dotmagazine, May 2018—Data Center Security, 7 pages, <https://www.dotmagazine.online/economic-engine-digital-infrastructure/mitigating-risks-to-data-center-operation>.

\* cited by examiner

| Cooling Components in DC_A | Rack | System Type | Recommended Operating Temperature Range (°C) | Allowable Operating Temperature Range (°C) | 9/14/2020 Average T(°C) | 9/14/2020 Max T(°C) | 9/15/2020 Average T(°C) | 9/15/2020 Max T(°C) | 9/16/2020 Average T(°C) | 9/16/2020 Max T(°C) | Host System and Apps |
|---|---|---|---|---|---|---|---|---|---|---|---|
| PACU1 | rack_A Upper | Network Gear | 18 to 27 | 5 to 40 | 19 | 20 | 19 | 20 | 19 | 20 | |
| PACU1 | rack_A Lower | Network Gear | 18 to 27 | 5 to 40 | 19 | 20 | 19 | 20 | 19 | 20 | |
| PACU2 | rack_B Upper | Computer System | 18 to 27 | 5 to 40 | 22 | 26 | 22 | 26 | 22 | 26 | |
| PACU2 | rack_B Lower | Computer System | 18 to 27 | 5 to 40 | 22 | 26 | 22 | 26 | 22 | 26 | App_A, App_B, App_C |
| PACU3 | rack_C Upper | STG_A Storage | 22 | 16 to 32 | 26.25 | 40 | 26.25 | 41 | 26.25 | 41 | |
| PACU3 | rack_C Lower | STG_A Storage | 22 | 16 to 32 | 23 | 38 | 25 | 38 | 25 | 38 | |
| PACU4 | rack_D Upper | STG_B Storage | 22 | 16 to 32 | 24 | 31 | 24 | 31 | 24 | 31 | |
| PACU4 | rack_D Lower | STG_B Storage | 22 | 16 to 32 | 24 | 31 | 24 | 31 | 24 | 31 | |

250

*FIG. 2B* ns of the invention. The drawings
DATA ANALYTICS FOR MITIGATION OF DATA CENTER THERMAL ISSUES

BACKGROUND

The present invention generally relates to the field of service infrastructure, and more particularly to a computer implemented method, system, and computer program product for mitigating the impact of data center thermal environmental issues on production applications.

A data center (DC) is a facility used to house computer systems and associated components, such as telecommunications and storage systems. Temperature in DC facilities naturally rises because the equipment in the data center continuously converts electrical power to heat as a byproduct of performing work. Unless the heat is removed, the ambient temperature increases, resulting in electronic equipment malfunction. Thus, the physical environment of a data center needs to be rigorously controlled. For that purpose, cooling systems are typically used in the DC to control the air temperature and humidity level, such that IT infrastructure components at the board level are kept within manufacturer's specified temperature and humidity ranges.

Typically, when a DC cooling system fails or abnormal thermal variances occur on the DC floor, non-critical applications are shut down to reduce heat dissipation and maintain DC thermal parameters under control. This helps in maintaining the availability of critical applications. If the situation aggravates, further steps can be implemented for maintaining application availability including, for example, activating a disaster recovery (DR) site and transfer workloads to an alternate facility. Unfortunately, these approaches do not align the resolution actions to business events, cost imperatives, resiliency requirements, and application-related considerations. Thus, it would be desirable that an alternate way to respond to thermal problems in a DC facility is available for interested parties.

SUMMARY

The present disclosure recognizes the shortcomings and problems associated with mitigation of thermal issues in a DC environment. Particularly, the need for a dynamic and real-time approach for mitigating the impact of DC thermal problems based on a correlation between business events and application characteristics. Therefore, there is a need for a method and system to respond to DC thermal challenges that include the resiliency of an application infrastructure, ongoing business events, execution priority, etc., and provide an application-oriented solution for maintaining availability of the IT infrastructure and business applications.

Shortcomings of the prior art are overcome and additional advantages are provided through the provision of a computer-implemented method for mitigating an impact of thermal environmental issues in a data center. The method includes retrieving, by a computer, from a centralized repository first data corresponding to I/O and processing activities of an infrastructure component executing one or more applications, second data corresponding to an application-to-infrastructure map, and third data corresponding to a business priority of the one or more applications. Based on the first data and the second data, the computer maps the one or more applications to heat generation values of the infrastructure component, and based on the mapping determines a thermal load of the one or more applications on the infrastructure component using data analytics. Based on the third data, the computer identifies an execution priority for the one or more applications and generates a correlative mapping between the execution priority and the thermal load of the one or more applications.

The method further includes retrieving, by the computer, from the centralized repository fourth data corresponding to a plurality of thermal parameters associated with the infrastructure component and a plurality of thermal parameters associated with the data center. In response to determining that at least one parameter in the plurality of thermal parameters associated with the infrastructure component and the plurality of thermal parameters associated with the data center exceeds a predefined threshold value, the computer generates a resolution plan including an ordered sequence of resolution actions based on the correlative mapping between the execution priority and the thermal load of the one or more applications.

Another embodiment of the present disclosure provides a computer program product for mitigating an impact of thermal environmental issues in a data center, according to the method described above.

Another embodiment of the present disclosure provides a computer system for mitigating an impact of thermal environmental issues in a data center, according to the method described above.

BRIEF DESCRIPTION OF THE DRAWINGS

The following detailed description, given by way of example and not intended to limit the invention solely thereto, will best be appreciated in conjunction with the accompanying drawings, in which:

FIG. 2B depicts sample data pertaining to a point in time thermal environmental data associated with a data center, according to an embodiment of the present disclosure;

Figure 1:
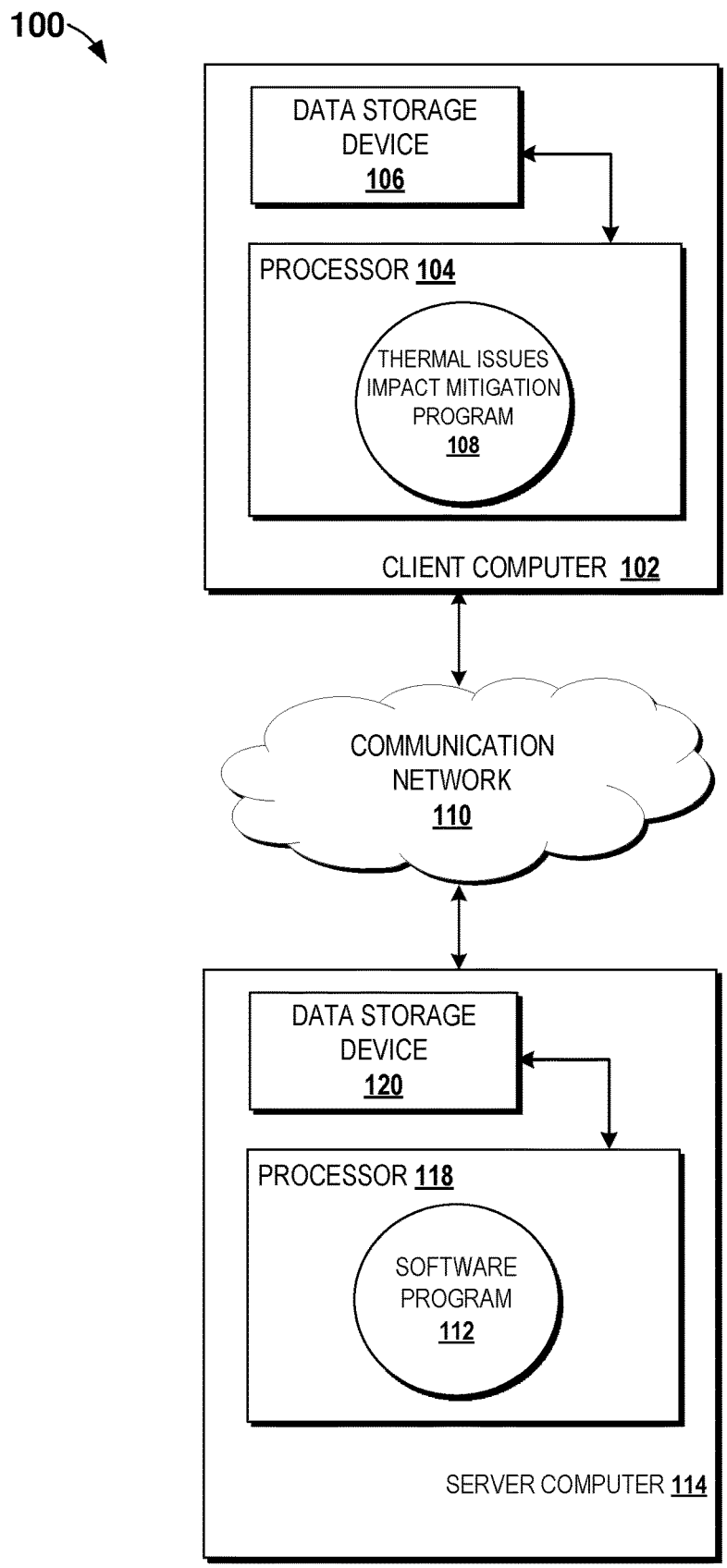
FIG. 1 is a block diagram illustrating a networked computer environment, according to an embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Indoor thermal environmental conditions in data centers (DC) can be negatively impacted by events such as failure of a cooling infrastructure component, abnormal heat dissipation in DC computer equipment and the resulting formation of abnormal heat isles, inefficient cooling fluid flow, etc. Actions taken to resolve these issues and control DC thermal environmental conditions may affect application availability, which in turn can impact business operations and lead to tangible and intangible losses for clients and/or businesses. For instance, a development team may be working on a rapid release cycle to expedite the time-to-market of a product to gain competitive advantage. If a thermal event occurs in the DC during such time, there is no mechanism to factor in the business priority of such applications, and accordingly redefine the mitigation actions.

Instead, following traditional shutdown approaches can lead to availability issues for the development system that can cause direct revenue impact to the business since traditional approaches for responding to DC thermal environmental issues do not consider the correlation between business events and application characteristics. This in turn can translate into a critical application availability issue leading to a business productivity loss.

Accordingly, it would be desirable that solutions for DC thermal issues take into account the business-related factors and correspondingly adjust application priorities to determine the best course of action. For example, by analyzing application characteristics (e.g., application IO, processing rates, etc.), weighing their impact on the IT infrastructure, and applying business/application priorities, a mitigation plan can be developed for minimizing the impact of DC thermal environmental issues on business activities and goals.

Therefore, embodiments of the present invention provide a method, system, and computer program product for establishing a correlation between business events and application characteristics to generate a resolution plan that mitigates the impact of DC environmental thermal issues. The proposed embodiments can maintain resiliency of the application infrastructure and prevent potential disasters that can impact critical applications. Particularly, the following described exemplary embodiments provide a system, method, and computer program product to, among other things, determining a business priority of an application, mapping application IO and processing activity to infrastructure heat generation, automatically performing a thermal impact analysis of the applications on the IT infrastructure components, and applying the application priority information to the thermal impact analysis for generating a resolution plan to mitigate the impact of thermal environmental issues in a data center.

Thus, the present embodiments have the capacity to improve the technical field of service infrastructure by identifying computer systems that are at higher utilization (i.e., above average processing and IO activity), inter-system dependencies, and ongoing business events to perform a correlative analysis based on which an optimal order of resolution actions can be dynamically determined to reduce the impact of thermal environmental problems in an effective manner. The proposed embodiments continuously monitor applications at component level as well as the DC thermal parameters to dynamically assist clients on selecting the best resolution actions during adverse thermal environmental situations.

Additionally, the proposed embodiments may, among other things, allow intelligent decision making to manage application availability during a DC thermal environmental issue, addressing the impact of DC thermal environmental issues with an application and business-priority-oriented view, generate analytics driven recommendations that enable IT managers to consider and implement multiple distinct options to manage the workload availability during DC thermal environment issues, and develop prediction models based on the estimated thermal impact on the application components to alert DC users.

Referring now to FIG. 1, an exemplary networked computer environment 100 is depicted, according to an embodiment of the present disclosure. FIG. 1 provides only an illustration of one embodiment and does not imply any limitations with regard to the environments in which different embodiments may be implemented. Many modifications to the depicted environment may be made by those skilled in the art without departing from the scope of the invention, as recited by the claims.

The networked computer environment 100 may include a client computer 102 and a communication network 110. The client computer 102 may include a processor 104, that is enabled to run a thermal issues impact mitigation program 108, and a data storage device 106. Client computer 102 may be, for example, a mobile device, a telephone (including smartphones), a personal digital assistant, a netbook, a laptop computer, a tablet computer, a desktop computer, or any type of computing devices capable of accessing a network.

The networked computer environment 100 may also include a server computer 114 with a processor 118, that is enabled to run a software program 112, and a data storage device 120. In some embodiments, server computer 114 may be a resource management server, a web server or any other electronic device capable of receiving and sending data. In another embodiment, server computer 114 may represent a server computing system utilizing multiple computers as a server system, such as in a cloud computing environment.

The thermal issues impact mitigation program 108 running on client computer 102 may communicate with the software program 112 running on server computer 114 via the communication network 110. As will be discussed with reference to FIG. 4, client computer 102 and server computer 114 may include internal components and external components.

The networked computer environment 100 may include a plurality of client computers 102 and server computers 114, only one of which is shown. The communication network 110 may include various types of communication networks, such as a local area network (LAN), a wide area network (WAN), such as the Internet, the public switched telephone network (PSTN), a cellular or mobile data network (e.g., wireless Internet provided by a third or fourth generation of mobile phone mobile communication), a private branch exchange (PBX), any combination thereof, or any combination of connections and protocols that will support communications between client computer 102 and server computer 114, in accordance with embodiments of the present disclosure. The communication network 110 may include wired, wireless or fiber optic connections. As known by those skilled in the art, the networked computer environment 100 may include additional computing devices, servers or other devices not shown.

Plural instances may be provided for components, operations, or structures described herein as a single instance. Boundaries between various components, operations, and data stores are somewhat arbitrary, and particular operations are illustrated in the context of specific illustrative configurations. Other allocations of functionality are envisioned and may fall within the scope of the present invention. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the present invention.

Figure 2A:
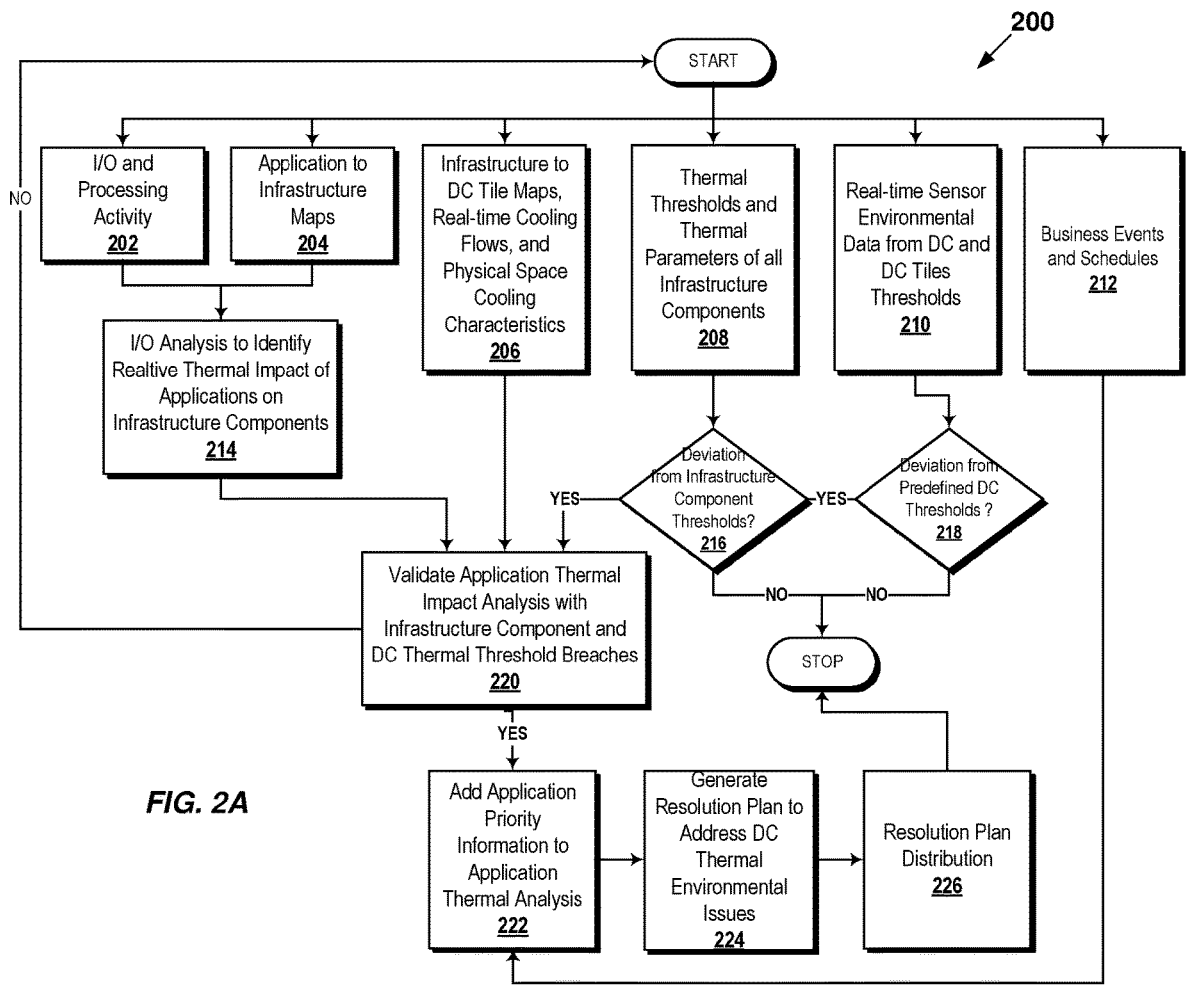
FIG. 2A depicts a computer system for mitigating an impact of thermal environmental issues in a data center based on application prioritization, according to an embodiment of the present disclosure.

Referring now to FIGS. 2A-2B, a computer system 200 for mitigating the impact of data center thermal issues in a data center is shown, according to an embodiment of the present disclosure.

According to an embodiment, the computer system 200 via, for example, the thermal issues impact mitigation program 108 (FIG. 1) collects a plurality of data corresponding to a processing load and thermal environmental parameters associated with the data center facility and IT infrastructure components as well as the individual thresholds of IT infrastructure components. The plurality of data collected by the computer system 200 can be retrieved from, for example, data center infrastructure management (DCIM) tools or other existing information repositories (e.g., Enterprise Data Lake). As known by those skilled in the art, DCIM tools monitor, measure, manage and/or control data center utilization and energy consumption of all IT-related equipment (such as servers, storage, and network switches) and facility infrastructure components (such as power distribution units [PDUs] and computer room air conditioners [CRACs]). DCIM tools also poll and gather environmental data within the DC from sensors and monitoring equipment.

According to an embodiment, the computer system 200 automatically collects data associated with a processing load of all applications being executed by the computer system 200 Specifically, as illustrated in the figure, the computer system 200 collects data associated with I/O and processing activity of all application components at 202, data associated with application to infrastructure maps at 204 (i.e., identifying and mapping interactions and relationships between applications and the underlying infrastructure), and data associated with IT infrastructure to DC physical floor tile maps, real-time cooling flows, and physical space cooling characteristics (e.g., cooling characteristics of physical racks at various heights) at 206. As known by those skilled in the art, all IT infrastructure components consume power in order to operate, and power produces heat. Thus, applications with high processing loads can be recognized as producing or dissipating higher amounts of heat.

Simultaneous to obtaining processing load information, the computer system 200 collects thermal data associated with the DC environment (e.g., environmental parameters) and IT infrastructure components. For example, the computer system 200 collects data associated with thermal parameters and thresholds of all infrastructure components at 208 (i.e., manufacturer's settings, normal operating range of ambient temperatures, current operating temperature values, etc.), and data associated with real-time environmental parameters from instruments and sensors in the DC and DC tile thresholds at 210 (e.g., temperature, humidity, etc.). According to an embodiment, instruments and sensors from which real-time environmental parameters can be retrieved may include internet-of-things (IoT) devices present in the DC facility. Thermal data collected from available IT infrastructure components and IoT sensors can then be compared with identified thresholds values associated with IT infrastructure and DC components and environmental parameters (e.g., maximum operating temperature range for infrastructure components vs. current DC temperature).

Further, in this embodiment, the computer system 200 collects information corresponding to ongoing business events and schedules at 212. By doing this, the computer system 200 can determine an execution priority for each application at a determined time and categorize applications based on a business priority. Stated differently, the computer system 200 can determine which applications are the most important from a business perspective and recommend an order in which they need to be executed for an effective business operation.

In some embodiments, the plurality of data collected by the computer system 200 at 202, 204, 206, 208, and 210 can be stored in a centralized repository (not shown) associated with the data center facility.

According to an embodiment, the computer system 200 performs at 214 an analysis of the collected I/O and processing activity (202) and application to infrastructure maps (204) using correlative analytics to assess the thermal impact of each application on infrastructure components. Specifically, the computer system 200 via an analytics engine, generates at 214 a correlative mapping of the application's I/O activities to heat generation of one or more infrastructure components based on which a thermal impact analysis of the application can be performed. Based on the thermal impact analysis, the computer system 200 may determine a behavior of the one or more infrastructure components when thermal problems occur and there are overall changes in operating conditions.

As the correlative analytics assessment is performed, the computer system 200 determines threshold breaches in thermal parameter(s) associated with one or more DC environmental conditions and infrastructure components. Accordingly, the computer system 200 determines at 218, based on the real-time sensor environmental data (210), whether a thermal parameter associated with the DC has exceeded a predefined threshold. Similarly, the computer system 200 determines at 216, based on the collected thermal data for each infrastructure component (208), whether a thermal threshold or thermal parameter associated with one or more infrastructure components exceeds a predefined value. If the computer system 200 determines at 216 and 218 that thermal values associated with the DC environment and infrastructure components are within a normal range, the computer system 200 stops the verification process.

In response to determining at 216 and 218 that at least one of a DC thermal environmental threshold and an infrastructure component thermal threshold have been exceeded, the computer system 200 at 220 validates and reconciles the thermal impact analysis performed at 214 with the infrastructure components mapping collected at 206 and infrastructure component and DC thermal threshold breaches detected at 216, 218. Data collected at 206 may include infrastructure to DC physical floor tile maps, real-time cooling flows, and physical space cooling characteristics.

It should be note that the validation of the thermal impact analysis performed at 220 represents a critical safety check for the whole computer system 200. Specifically, if at 220 the data collected at 202, 204 (left branch of the computer system 200) does not correlate with the data collected at 206, 208, 210 (right branch of the computer system 200), it indicates that the collected data is out of sync and there are possible gaps on either branch of the computer system 200 that are causing such a discrepancy which must be addressed. When both sides reconcile with each other (i.e., collected data correlates) at 220, it is an evidence that all data collected is in order and actionable, and the computer system 200 continues with the next action.

According to an embodiment, the computer system 200 then adds to the thermal impact analysis, at 222, the application priority information determined using the business events and schedules data collected at 212. Specifically, the computer system 200 at 222 maps application prioritization to thermal impact analysis information performed at 220 such that, in the event of a thermal problem, applications with a high business priority are kept available.

Accordingly, the computer system 200 dynamically analyzes business considerations and determines relative prioritization of applications based on the application thermal impact analysis (220) and application priority information (222). In some embodiments, the computer system 200 may allow stakeholders or investors to tag application priorities in a system readable configuration file and dynamically factor in such inputs. Thus, the computer system 200 can maintain a dynamic application execution priority list including an order of preference determined according to business needs and application characteristics that guarantees availability of high priority applications when the DC thermal issues occur.

Based on the application thermal impact analysis and application priority information, the computer system 200 generates at 224 a resolution plan for addressing the impact of a current thermal environmental issue including distributing at 226 the resolution plan to interested parties (e.g., corresponding IT managers, business stakeholders, investors, etc.). According to an embodiment, the generated resolution plan may recommend or suggest performing the following actions:

1) Identify applications or application components that can be shutdown safely;
2) Identify applications or application components that can be failed over or transparently migrated to other infrastructure components residing in the same DC or site;
3) Identify applications that can be failed over to an alternate site;
4) Identify applications or application components that may need to be scaled down or distributed to other computer equipment without impacting availability;
5) Redirect a processing load by reconfiguring load balancers;
6) Re-adjust and redistribute DC cooling flows based on anticipated thermal indices in heat isles of the DC; and
7) Share the resolution plan with interested parties for follow-up actions.

Data center, infrastructure and application (DC/Infra/App) teams may further develop specific actions plans in-line with the recommendations in the resolution plan (224) to address an ongoing DC environmental issue while maintaining the availability of applications that hold highest priority at a current time. Additionally, the computer system 200 can analyze time series thermal data of applications and establish a thermal prediction model. This data can be utilized to proactively predict the thermal impact on the application components and notify IT managers, so they are prepared in advance to handle adverse situations effectively. More particularly, the thermal prediction model can be generated using machine learning (ML) and artificial intelligence (AI). Since the computer system 200 maintains historic data of previous occurrences of DC thermal events and the actions taken thereof, the ML component learns from interpreting the historic data and predicts future events when associated base conditions begin to develop in the DC.

With reference now to FIG. 2B, a table 250 shows an illustration of DC environmental data collected, correlated and reconciled when a DC thermal issue has occurred. Specifically, table 250 shows the thresholds breached, the floor space where it occurred, the infrastructure racks on the floor where breaches have occurred and the IT systems involved in the threshold breaches.

In this exemplary embodiment, a client (e.g., company X) has two data centers (DC): Primary Data Center (DC_A) and Secondary Data Center (DC_B). All client business applications (e.g., Prod, Dev, Test etc.) and associated infrastructure are hosted in DC_A, while DC_B is a disaster recovery (DR) facility. Local high availability is configured at the storage layer in DC_A.

According to an embodiment, applications and associated infrastructure are hosted in DC_A according to the following outline:

1) Production application (App_A) constitutes two virtual machines (VMs), i.e., VM_A and VM_B, and the corresponding storage is served from primary and secondary storage systems STG_A, STG_B, respectively. The primary and secondary storage systems STG_A, STG_B are configured in highly available (HA) topology.
2) Development (Dev) application (App_B) constitutes two VMs, i.e., VM_C and VM_D, and the corresponding storage is served from storage system STG_A.
3) Test application (App_C) constitutes two VMs, i.e., VM_E and VM_F, and the storage is served from storage system STG_A.
4) Network infrastructure associated with all these applications is installed in rack A located in DC_A floor tile 05.
5) Computer systems associated with App_A, App_B and App_C are installed in rack B, at various heights located in DC_A floor tile 10.
6) Primary Storage system STG_A serving App_A, App_B and App_C is installed in rack C, located in DC_A floor tile 15.
7) Secondary Storage system STG_B serving App_A, App_B and App_C is installed in rack D, located in DC_A floor tile 20.

Similarly, in this embodiment, cooling areas in DC_A are organized according to the following outline:

1) Precision Air Conditioning Unit (PACU)1 is serving components hosted in rack A.
2) PACU2 is serving components hosted in rack B.
3) PACU3 is serving components hosted in rack C.
4) PACU4 is serving components hosted in rack D.

For illustration purposes, it is assumed that a cooling component in the DC has failed, and that the thermal parameter readings (e.g., temperature) associated with the storage systems are gradually rising (based on heat dissipation in the hardware components). As explained above, a situation like this can cause, for example, an automatic shutdown of the storage subsystems and resulting application outages, or a failure of storage subsystems, if the thermal environmental issue persists for an extended amount of time. Thus, to maintain availability of critical applications, the proposed computer system 200 for mitigating the impact of thermal issues in a data center based on an application priority performs the following steps:

1) Perform an application thermal impact analysis by:

a) collecting metrics associated with real-time I/O and processing activity 202 (FIG. 2A) from all the application components and thermal parameters of each hardware subsystem, i.e., computer, storage and network.

b) using the application-to-infrastructure mapping 204 (FIG. 2A), a load analysis is performed to determine a relative impact of I/O and processing activity on the source (e.g., computer) and target (e.g., storage, network) infrastructure components. According to the present exemplary embodiment, based on the load analysis the computer system 200 determines that: VM_C is the top contributor of thermal dissipation on source and target infrastructure components due to the load running on it; VM_A and VM_B are the next top contributors of thermal dissipation on source and target infrastructure components; and VM_F is the least contributor of thermal dissipation on source and target infrastructure components.

2) All DC environmental data including cooling flow data and DC heatmaps, and infrastructure component temperatures are collected in real-time (206, 208, 210).

3) Information on business metrics, business and application priorities, business events and schedules etc. is collected and maintained in a centralized repository (212). As mentioned above, in some embodiments, stakeholders can review and provide an input on application priority. Based on the collected business-related information, the computer system 200 determines that: App_B is currently critical to the client as its external launch and go to market dates are rapidly approaching (this product release cycle dictates priority); App_A is critical as a production application (current top revenue earner); and App_C is a non-critical application.

Assuming that the failed cooling component is PACU3 in DC_A, PACU3 failure can lead to inefficient cooling near rack C where the primary storage system STG_A is located, as indicated by the shaded rows in Table 250. Accordingly, the computer system 200 polls and monitors thermal parameters corresponding to the storage systems. When the thermal readings exceed the predefined thermal thresholds, automatically a storage system threshold deviation flag is generated based on the application thermal impact analysis.

4) Based on the business and application priorities, an overall mitigation plan is proposed to the stakeholders as a sequence of mitigation steps in an optimal order (224, 226). For instance, a possible sequence of mitigation steps may include, but are not limited to:

a) Migrate VM_C data store from STG_A to STG_B;

b) Redirect the IO from VM_A and VM_B to STG_B (secondary volumes) and mark the primary volumes offline;

c) Monitor the thermal parameters of the storage system STG_A;

d) If the temperature does not fall below threshold, shutdown VM_F; and e) If the DC thermal cooling failure issue still persists, propose next set of actions including, for example, failing over critical workloads to the DR facility.

It should be noted that, the example sequence of mitigation steps proposed above takes into account the most critical workloads as well as business priorities at a present time, as opposed to static, predetermined action plans for shutting down workloads during thermal events that neglect the impact of application shutdown on business activities.

Figure 3A:
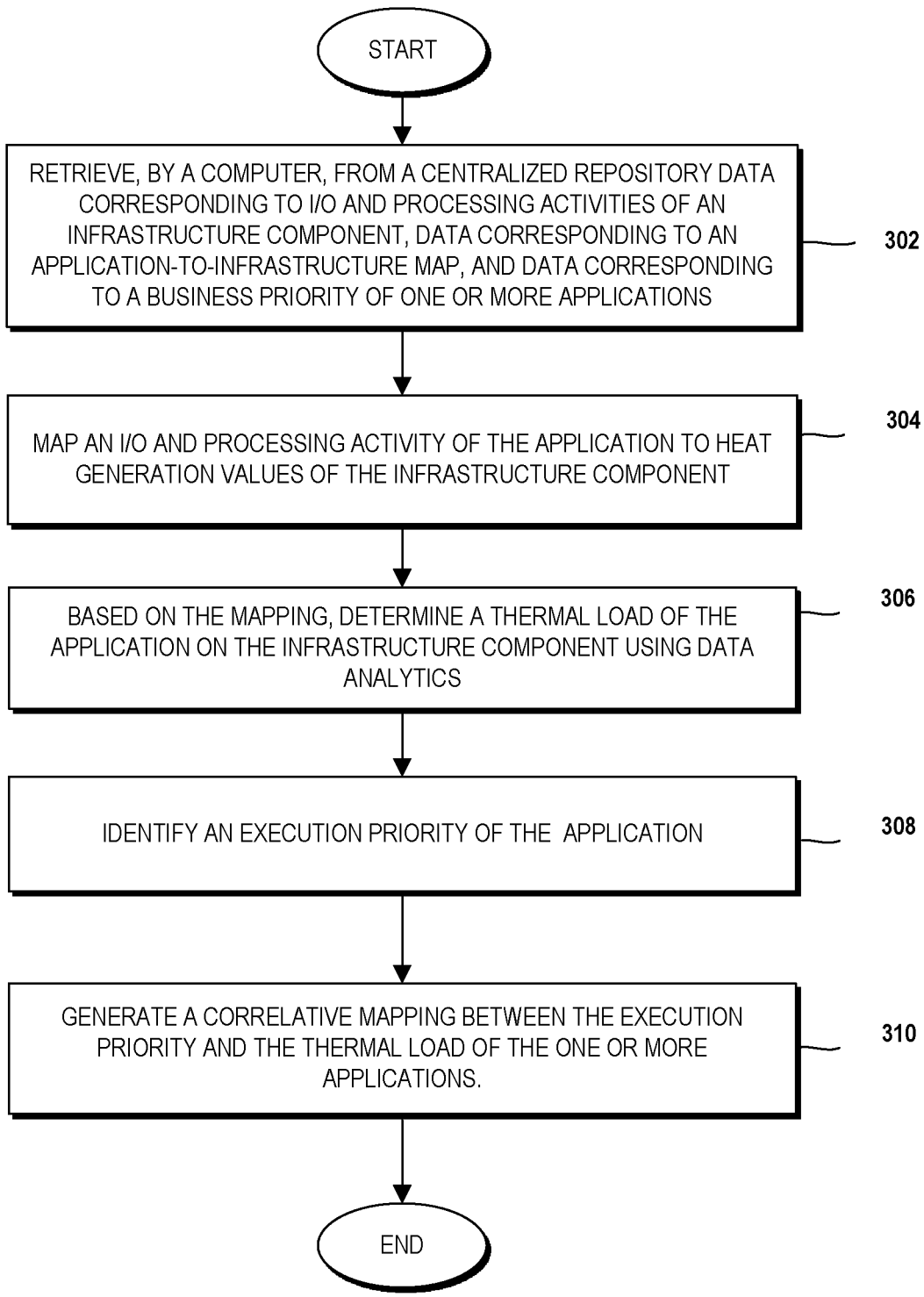
FIG. 3A depicts a flowchart illustrating the steps of a computer-implemented method for correlating an application thermal load to an execution priority, determined based on business needs, according to an embodiment of the present disclosure.

Referring now to FIG. 3A, a flowchart 300 illustrating the steps of a computer-implemented method for correlating an application thermal load to an execution priority based on business needs is shown, according to an embodiment of the present disclosure.

The process starts at 302 by retrieving from a centralized repository first data corresponding to I/O and processing activities of infrastructure components executing one or more applications, second data corresponding to application-to-infrastructure maps, and third data corresponding to a business priority of the one or more applications. At step 304, based on the retrieved first data and second data, one or more applications are mapped to heat generation values of corresponding infrastructure components.

The process continues at step 306 in which, based on the mapping of the one or more applications to heat generation values of the infrastructure components, a thermal load of the one or more applications on the infrastructure components can be determined using data analytics. At step, 308 an execution priority associated with the one or more applications is identified based on the retrieved third data. The third data may include, for example, information corresponding to business metrics, business and application priorities, business events and schedules from which an execution priority for the one or more applications can be determined.

Finally, a correlative mapping between the determined execution priority and the thermal load of the one or more applications is generated at step 310. It should be noted that data corresponding to infrastructure to data center tile maps, real-time cooling flows, and physical space cooling characteristics can also be retrieved from the centralized repository and added to the correlative mapping between the execution priority and the thermal load of the one or more applications. As will be described in detail below with reference to FIG. 3B, the generated correlative mapping can be used to create a resolution plan for addressing the impact of thermal problems in the data center focused on maintaining the availability of high priority applications.

Figure 3B:
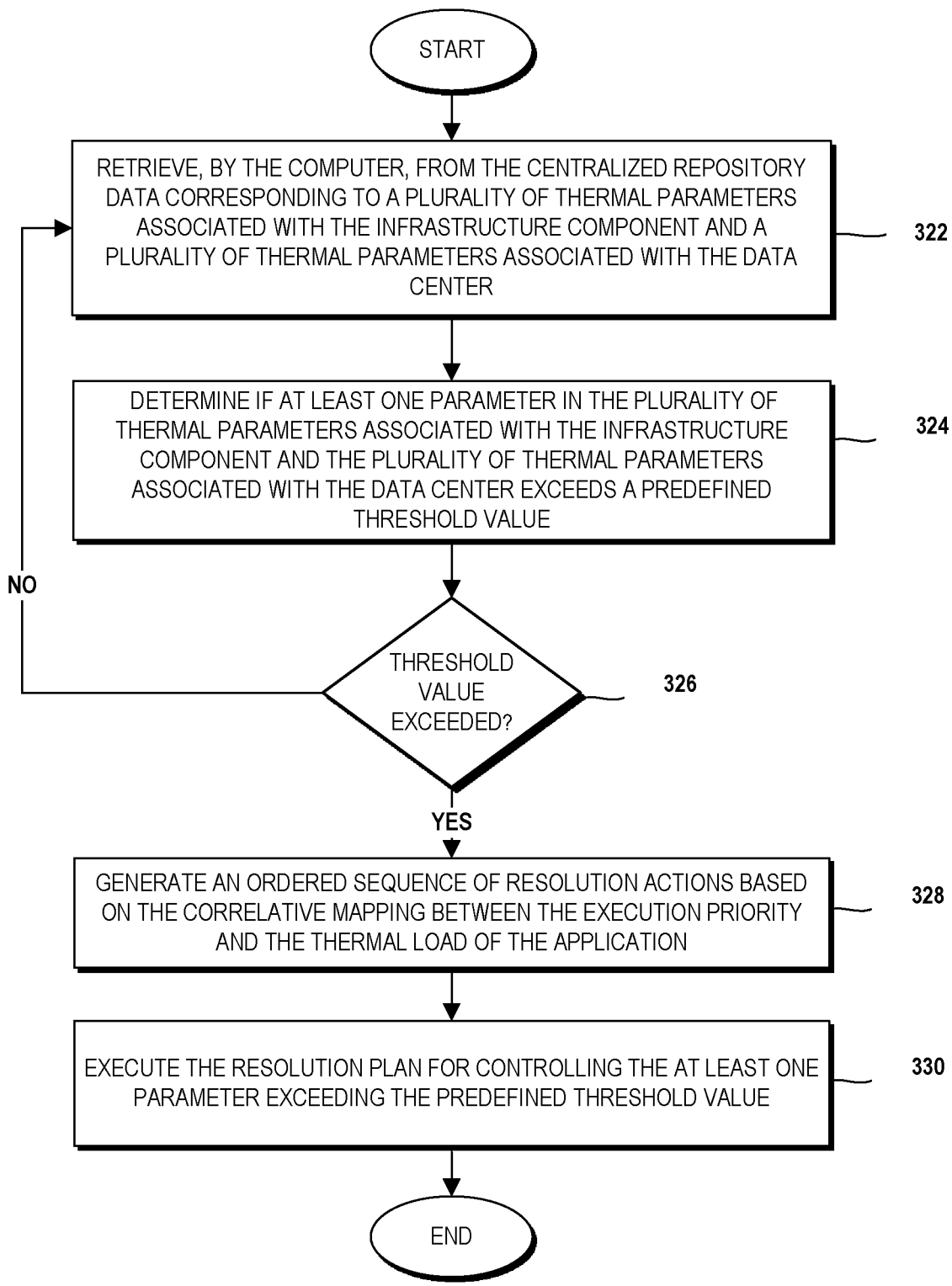
FIG. 3B depicts a flowchart illustrating the steps of a computer-implemented method for generating a resolution plan for addressing data center thermal problems using the correlative mapping between application thermal load and execution priority of FIG. 3A, according to an embodiment of the present disclosure.

Referring now to FIG. 3B, a flowchart 320 illustrating the steps of a computer-implemented method for generating a resolution plan for addressing the impact of thermal problems using the correlative mapping between application thermal load and execution priority of FIG. 3A is shown, according to an embodiment of the present disclosure.

In this embodiment, the process starts at step 322 by retrieving from the centralized repository fourth data corresponding to a plurality of thermal parameters associated with the infrastructure components and a plurality of thermal parameters associated with the data center. Specifically, the fourth data corresponding to thermal parameters of the infrastructure components and thermal parameters of the data center includes thermal thresholds and parameters associated with each infrastructure component and real-time environmental data from the data center and data center tiles. According to an embodiment, the real-time environmental data from the data center and data center tiles can be obtained from a plurality of internet of things devices available within the data center facility.

At step 324, it is determined whether at least one parameter in the plurality of thermal parameters associated with the infrastructure components and the plurality of thermal parameters associated with the data center exceeds a predefined threshold value. In response to determining, at step 326, that the at least one parameter in the plurality of thermal parameters associated with the infrastructure components and the plurality of thermal parameters associated with the data center exceeded the predefined threshold value, an ordered sequence of resolution actions based on the correlative mapping between the execution priority and the thermal load of the one or more applications is generated at step 328. If, at step 326, it is determined that none of the plurality of thermal parameters associated with the infrastructure components and the plurality of thermal parameters associated with the data center exceeds the predefined threshold value, the process returns to step 322 to continue monitoring the plurality of thermal parameters.

The process continues at step 330 in which the resolution plan is executed for controlling at least one parameter exceeding the predefined threshold value while maintaining availability of high priority applications.

According to an embodiment, the ordered sequence of resolution actions based on the correlative mapping between the execution priority and the thermal load of one or more applications may include the following steps: identify at least one application from the one or more applications that can be shutdown safely, identify at least one application from the one or more applications that can be failed over to other infrastructure components within the data center, identify at least one application from the one or more applications that can be failed over to an alternate site, identify at least one application from the one or more applications that can be distributed to other computer equipment without impacting application availability, redirect a processing load by reconfiguring load balancers, and readjust and redistribute cooling flows within the data center based, at least in part, on anticipated thermal indices in heat isles of the data center. Further, the resolution plan can be automatically distributed between data center managers.

In some embodiments, data center managers and business stakeholders are capable of providing inputs. The latter can also assign and modify the application priorities which can be used to update data related to application priorities. This can be accomplished by a system readable configuration file in the thermal impact issues mitigation program. All such inputs are factored dynamically in the mitigation plan generation.

Therefore, embodiments of the present disclosure provide a method and system for addressing the impact of thermal environmental issues in a data center that maintain application availability based on business-related considerations as well as application characteristics, as opposed to an infrastructure-oriented view. The proposed embodiments may minimize revenue losses from incidents related to environmental thermal issues. Application of the proposed embodiments at, for example, cloud data centers and managed service facilities may help companies minimizing adverse business impact to its clients when problems related to DC thermal environmental issues occur.

The proposed embodiments provide a resolution plan based on a correlation between business events and application characteristics that prioritizes maintaining the resiliency of an application infrastructure. During an adverse thermal environmental event, the proposed embodiments are capable of aligning resolution actions to ongoing business events and accordingly prioritize application execution for minimizing the impact of the thermal event on the overall business. The proposed embodiments take into account that external events, business priorities, rapid application release cycles, time to market considerations, and newer operational models cause the business priorities to vary dynamically, and thus the applications hold varying degrees of importance cyclically from a business point of view.

Figure 4:
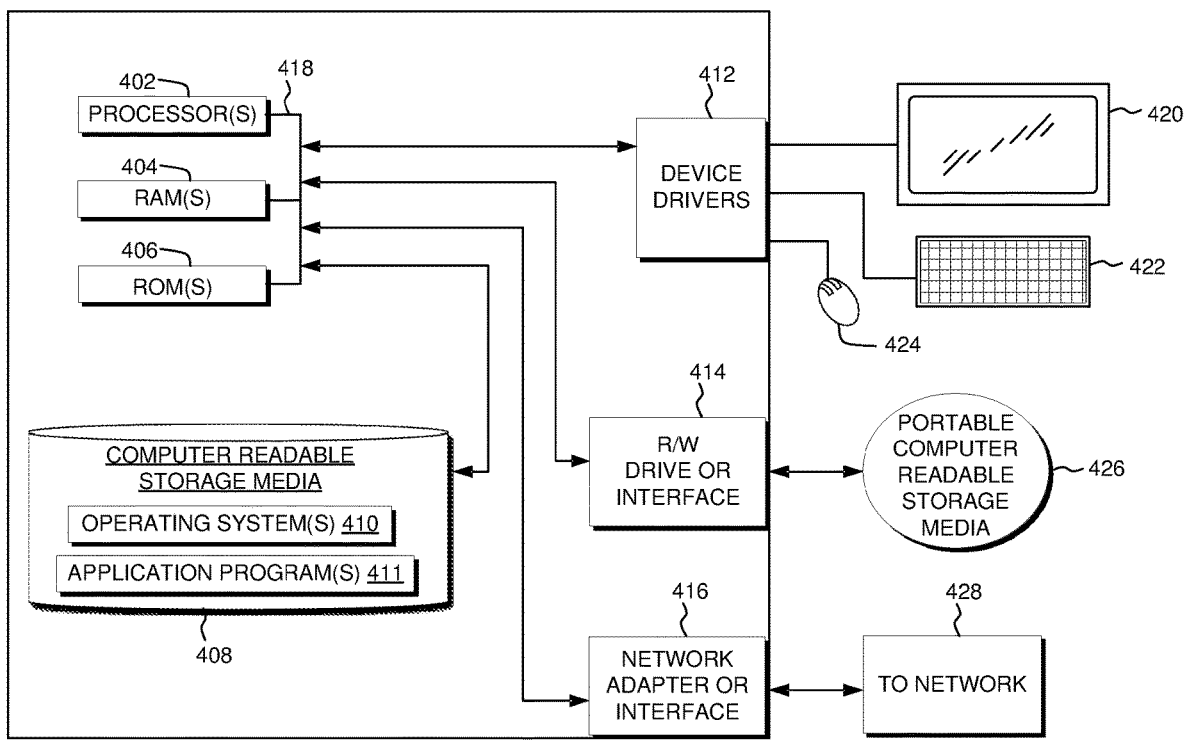
FIG. 4 is a block diagram of internal and external components of a computer system, according to an embodiment of the present disclosure.

Referring now to FIG. 4, a block diagram of components of client computer 102 and server computer 114 of networked computer environment 100 of FIG. 1 is shown, according to an embodiment of the present disclosure. It should be appreciated that FIG. 4 provides only an illustration of one implementation and does not imply any limitations regarding the environments in which different embodiments may be implemented. Many modifications to the depicted environment may be made.

Client computer 102 and server computer 114 may include one or more processors 402, one or more computer-readable RAMs 404, one or more computer-readable ROMs 406, one or more computer readable storage media 408, device drivers 412, read/write drive or interface 414, network adapter or interface 416, all interconnected over a communications fabric 418. Communications fabric 418 may be implemented with any architecture designed for passing data and/or control information between processors (such as microprocessors, communications and network processors, etc.), system memory, peripheral devices, and any other hardware components within a system.

One or more operating systems 410, and one or more application programs 411 are stored on one or more of the computer readable storage media 408 for execution by one or more of the processors 402 via one or more of the respective RAMs 404 (which typically include cache memory). In the illustrated embodiment, each of the computer readable storage media 408 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

Client computer 102 and server computer 114 may also include a R/W drive or interface 414 to read from and write to one or more portable computer readable storage media 426. Application programs 411 on client computer 102 and server computer 114 may be stored on one or more of the portable computer readable storage media 426, read via the respective R/W drive or interface 414 and loaded into the respective computer readable storage media 408.

Client computer 102 and server computer 114 may also include a network adapter or interface 416, such as a TCP/IP adapter card or wireless communication adapter (such as a 4G wireless communication adapter using OFDMA technology) for connection to a network 428. Application programs 411 on client computer 102 and server computer 114 may be downloaded to the computing device from an external computer or external storage device via a network (for example, the Internet, a local area network or other wide area network or wireless network) and network adapter or interface 416. From the network adapter or interface 416, the programs may be loaded onto computer readable storage media 408. The network may comprise copper wires, optical fibers, wireless transmission, routers, firewalls, switches, gateway computers and/or edge servers.

Client computer 102 and server computer 114 may also include a display screen 420, a keyboard or keypad 422, and a computer mouse or touchpad 424. Device drivers 412 interface to display screen 420 for imaging, to keyboard or keypad 422, to computer mouse or touchpad 424, and/or to display screen 420 for pressure sensing of alphanumeric character entry and user selections. The device drivers 412, R/W drive or interface 414 and network adapter or interface

416 may include hardware and software (stored on computer readable storage media 408 and/or ROM 406).

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 5:
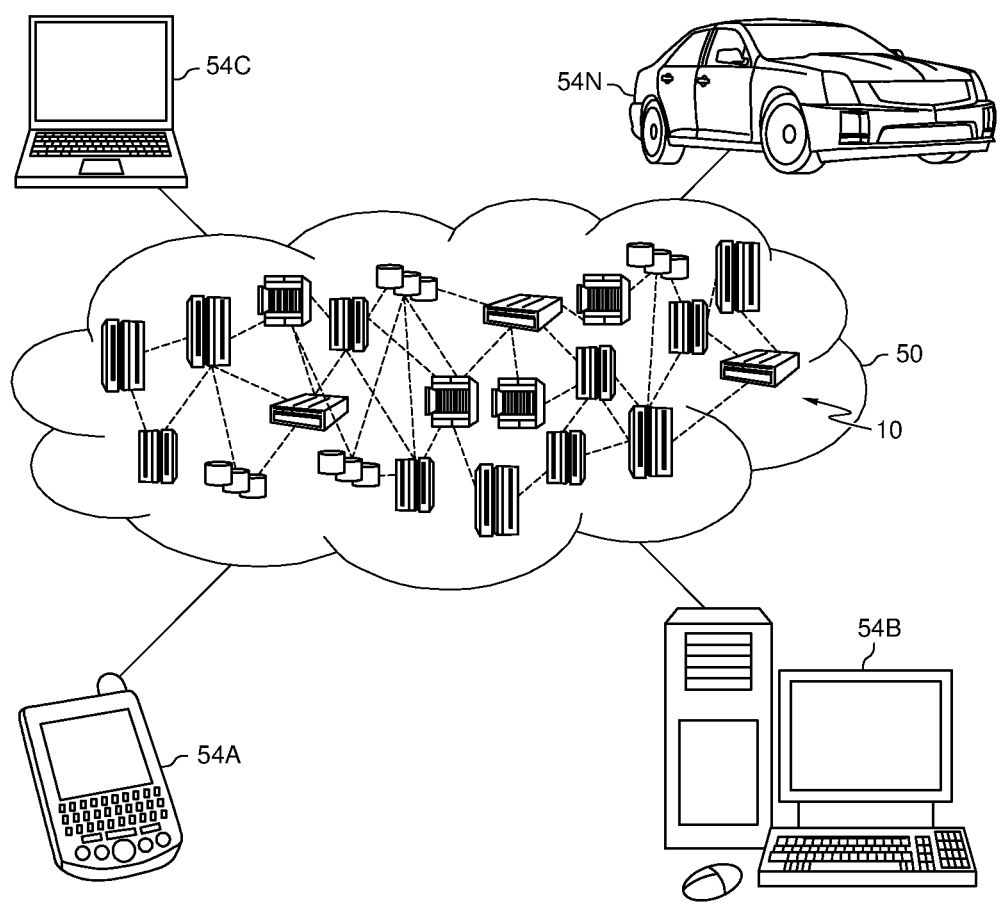
FIG. 5 is a block diagram of an illustrative cloud computing environment, according to an embodiment of the present disclosure.

Referring now to FIG. 5, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Figure 6:
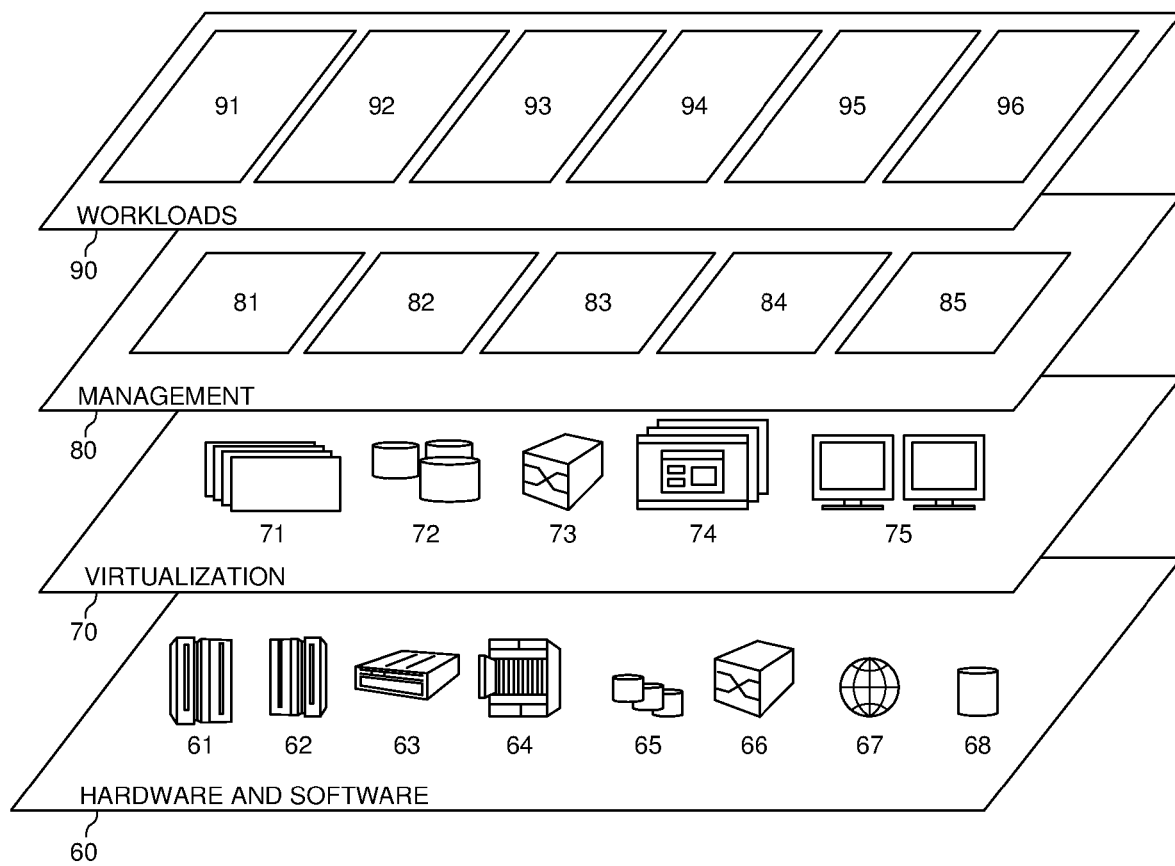
FIG. 6 is a block diagram of functional layers of the illustrative cloud computing environment of FIG. 5, according to an embodiment of the present disclosure.

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and system for mitigation of data center thermal issues 96.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While steps of the disclosed method and components of the disclosed systems and environments have been sequentially or serially identified using numbers and letters, such numbering or lettering is not an indication that such steps must be performed in the order recited, and is merely provided to facilitate clear referencing of the method's steps. Furthermore, steps of the method may be performed in parallel to perform their described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for mitigating an impact of thermal issues in a data center, the method comprising:
   retrieving, by a computer, first data corresponding to I/O and processing activities of an infrastructure component executing one or more applications, second data corresponding to an application-to-infrastructure map, third data corresponding to a business priority of the one or more applications, and fourth data corresponding to a plurality of thermal parameters associated with the infrastructure component and a plurality of thermal parameters associated with the data center;
   mapping, by the computer, the one or more applications to heat generation values of the infrastructure component based on the first data and the second data;
   determining, by the computer, a thermal load of the one or more applications on the infrastructure component using data analytics based on the mapping;
   identifying, by the computer, an execution priority for the one or more applications based on the third data; and
   generating, by the computer, a correlative mapping between the execution priority and the thermal load of the one or more applications;
   generating, by the computer, a resolution plan comprising an ordered sequence of resolution actions based on the correlative mapping in response to identifying that that a thermal parameter, of the plurality of thermal parameters, exceeds a predefined threshold value; and
   executing, by the computer, the resolution plan to control the thermal parameter.

2. The method of claim 1, further comprising:
   retrieving, by the computer, fifth data corresponding to:
      infrastructure to data center tile maps, real-time cooling flows, and physical space cooling characteristics; and
   adding, by the computer, the fifth data to the correlative mapping between the execution priority and the thermal load of the one or more applications.

3. The method of claim 1, wherein the third data corresponding to a business priority of the one or more applications comprises:
   information corresponding to at least one of business metrics, business and application priorities, business events, and schedules.

4. The method of claim 1, wherein the fourth data comprises:
   thermal thresholds and parameters associated with the infrastructure component, and
   real-time environmental data from the data center and data center tiles.

5. The method of claim 4, wherein the real-time environmental data from the data center and the data center tiles is obtained from a plurality of internet of things devices.

6. The method of claim 1, wherein the ordered sequence of resolution actions based on the correlative mapping between the execution priority and the thermal load of the one or more applications further comprises executing, by the computer, at least one of the following steps:
   identifying at least one application from the one or more applications that can be shutdown safely;
   identifying at least one application from the one or more applications that can be failed over to other infrastructure components within the data center;
   identifying at least one application from the one or more applications that can be failed over to an alternate site;
   identifying at least one application from the one or more applications that can be distributed to other computer equipment without impacting application availability;
   redirecting a processing load by reconfiguring load balancers; and
   readjusting and redistributing cooling flows within the data center based on anticipated thermal indices in heat isles of the data center.

7. The method of claim 1, further comprising;
   distributing, by the computer, the resolution plan between data interested parties; and
   receiving, by the computer, an input from the interested parties for executing the resolution plan including an updated execution priority for the one or more applications.

8. A computer system for mitigating an impact of thermal issues in a data center, the computer system comprising:
   a processor that when executing program instructions stored on as associated memory is configured to:
   retrieve first data corresponding to I/O and processing activities of an infrastructure component executing one or more applications, second data corresponding to an application-to-infrastructure map, third data corresponding to a business priority of the one or more applications, fourth data corresponding to a plurality of thermal parameters associated with the infrastructure component and a plurality of thermal parameters associated with the data center;
   generate a map of the one or more applications to heat generation values of the infrastructure component based on the first data and the second data;
   determine a thermal load of the one or more applications on the infrastructure component using data analytics based on the map;
   identify an execution priority for the one or more applications based on the third data; and
   generate a correlative mapping between the execution priority and the thermal load of the one or more applications;
   generate a resolution plan comprising an ordered sequence of resolution actions based on the correlative mapping in response to identifying that that a thermal parameter, of the plurality of thermal parameters, exceeds a predefined threshold value; and
   execute the resolution plan to control the thermal parameter.

9. The computer system of claim 8, wherein the processor is further configured to:
   retrieve fifth data corresponding to:
   infrastructure to data center tile maps, real-time cooling flows, and physical space cooling characteristics; and
   add the fifth data to the correlative mapping between the execution priority and the thermal load of the one or more applications.

10. The computer system of claim 8, wherein the third data corresponding to a business priority of the one or more applications comprises:
    information corresponding to at least one of business metrics, business and application priorities, business events, and schedules.

11. The computer system of claim 8, wherein the fourth data comprises:
    thermal thresholds and parameters associated with the infrastructure component, and
    real-time environmental data from the data center and data center tiles.

12. The computer system of claim 11, wherein the real-time environmental data from the data center and the data center tiles is obtained from a plurality of internet of things devices.

13. The computer system of claim 8, wherein the ordered sequence of resolution actions based on the correlative mapping between the execution priority and the thermal load of the one or more applications further configures the processor to:
    identify at least one application from the one or more applications that can be shutdown safely;
    identify at least one application from the one or more applications that can be failed over to other infrastructure components within the data center;
    identify at least one application from the one or more applications that can be failed over to an alternate site;
    identify at least one application from the one or more applications that can be distributed to other computer equipment without impacting application availability;
    redirect a processing load by reconfiguring load balancers; and
    readjust and redistribute cooling flows within the data center based, at least in part, on anticipated thermal indices in heat isles of the data center.

14. The computer system of claim 8, further comprising;
    distribute the resolution plan between data interested parties; and
    receive by the computer, an input from the interested parties for executing the resolution plan including an updated execution priority for the one or more applications.

15. A computer readable medium for mitigating an impact of thermal issues in a data center, the computer readable medium comprising instructions that when executed by a processor configure the processor to perform:
    retrieving first data corresponding to I/O and processing activities of an infrastructure component executing one or more applications, second data corresponding to an application-to-infrastructure map, and third data corresponding to a business priority of the one or more applications, and fourth data corresponding to a plurality of thermal parameters associated with the infrastructure component and a plurality of thermal parameters associated with the data center;
    mapping the one or more applications to heat generation values of the infrastructure component based on the first data and the second data;
    determining a thermal load of the one or more applications on the infrastructure component using data analytics based on the mapping;
    identifying an execution priority for the one or more applications; and generating a correlative mapping between the execution priority and the thermal load of the one or more applications;

generating a resolution plan comprising an ordered sequence of resolution actions based on the correlative mapping in response to identifying that that a thermal parameter, of the plurality of thermal parameters, exceeds a predefined threshold value; and executing the resolution plan to control the thermal parameter.

* * * * *